United States Patent
Loibl et al.

(10) Patent No.: US 7,952,885 B2
(45) Date of Patent: May 31, 2011

(54) CONTROL APPARATUS, IN PARTICULAR A MECHATRONIC TRANSMISSION CONTROL DEVICE OR ENGINE CONTROL DEVICE

(75) Inventors: Josef Loibl, Bad Abbach (DE); Karl Smirra, Wasserburg (DE)

(73) Assignee: Siemens Aktiengesellschaft, Munich (DE)

( * ) Notice: Subject to any disclaimer, the term of this patent is extended or adjusted under 35 U.S.C. 154(b) by 494 days.

(21) Appl. No.: 11/658,775

(22) PCT Filed: Apr. 29, 2005

(86) PCT No.: PCT/EP2005/051956
§ 371 (c)(1),
(2), (4) Date: Jan. 29, 2007

(87) PCT Pub. No.: WO2006/010652
PCT Pub. Date: Feb. 2, 2006

(65) Prior Publication Data
US 2009/0002959 A1    Jan. 1, 2009

(30) Foreign Application Priority Data
Jul. 28, 2004    (DE) .......................... 10 2004 036 683

(51) Int. Cl.
*H05K 1/00* (2006.01)
(52) U.S. Cl. ...................................... 361/749; 174/254

(58) Field of Classification Search .......... 361/748–751, 361/760; 174/50.1, 52.3, 539, 256, 254; 439/33, 492
See application file for complete search history.

(56) References Cited

U.S. PATENT DOCUMENTS

| | | | |
|---|---|---|---|
| 5,280,413 A | * | 1/1994 | Pai ................................ 361/792 |
| 6,300,566 B1 | | 10/2001 | Scheuerer et al. |
| 6,570,773 B1 | | 5/2003 | Loibl et al. |
| 6,737,579 B1 | | 5/2004 | Laufer et al. |
| 7,170,011 B2 | * | 1/2007 | Wallace ........................ 174/256 |
| 7,484,419 B2 | * | 2/2009 | Tsuda et al. .................... 73/756 |

FOREIGN PATENT DOCUMENTS

| | | |
|---|---|---|
| DE | 40 38 394 A1 | 6/1992 |
| DE | 44 37 664 A1 | 4/1995 |
| DE | 101 10 620 A1 | 9/2002 |
| EP | 0 708 583 A1 | 4/1996 |
| EP | 0 972 318 B1 | 1/2000 |
| EP | 1 239 710 A2 | 9/2002 |
| WO | WO03078211 | * 9/2003 |

* cited by examiner

*Primary Examiner* — Jinhee J Lee
*Assistant Examiner* — Yuriy Semenenko
(74) *Attorney, Agent, or Firm* — Laurence A. Greenberg; Werner H. Stemer; Ralph E. Locher

(57) ABSTRACT

A control device includes a number of individual flexible printed circuit boards that are preferably laminated on an aluminum base plate. A molded seal is used to reliably seal the edge areas of the partially flexible printed circuit board and these edge areas are formed to assist in creating the seal. The device is suited for mechatronic control units and is particularly suited for control devices that are mounted in a transmission or engine of a motor vehicle.

13 Claims, 8 Drawing Sheets

CONTROL APPARATUS, IN PARTICULAR A MECHATRONIC TRANSMISSION CONTROL DEVICE OR ENGINE CONTROL DEVICE

BACKGROUND OF THE INVENTION

Field of the Invention

The present invention relates to a control apparatus, in particular for mechatronic control devices associated with the transmission control or engine control of a motor vehicle. The apparatus includes:
- a circuit carrier which is connected to conductor paths of at least one flexible conductor path carrier, and
- a base plate on which the circuit carrier and the conductor path carrier are mounted, and
- a housing part which forms a cavity in which the circuit carrier is arranged, wherein
    - the conductor path carrier is guided between the base plate and the housing part into the cavity, and wherein
    - the conductor path carrier is adhered at least partly to the base plate by means of a liquid-resistant adhesive and sealed relative to the housing part by means of at least one gasket element, such that no liquid can penetrate into the cavity.

It is increasingly the case that automatic transmissions for private motor vehicles are largely electronically controlled, and this also applies to combustion engines or braking systems, etc. Whereas so-called "standalone" control devices for this purpose were previously provided for installation in an electronics space (e-box) offering protection against environmental influences or in the passenger compartment, there is a growing trend towards so-called mechatronic control units, i.e. the integration of control electronics and the associated sensor technology in the transmission, the engine, the braking system or similar. There are similar trends towards localized electronic systems in other fields outside of motor vehicle engineering, e.g. air travel and space travel engineering, ship engineering, etc.

In some applications of mechatronic control units, pressed screens are used for current and signal distribution. In comparison with so-called flexible technology, however, this solution exhibits clear disadvantages in respect of issues such as sealing the electronics space, stress protection, flexibility and tolerance equalization. Furthermore, as a result of complying with minimal cross sections of the pressed screens, routing of the conductor paths is more difficult than in the case of flexible conductor paths (construction of extremely fine Cu conductor path structures). In addition, modifications require costly intervention in the pressing tool.

As illustrated in FIGS. 1 to 5, current production applications for e.g. a mechatronic transmission control unit comprise a circuit carrier 30 which is connected to conductor paths 23 of at least one flexible conductor path carrier 20 for the distribution of electrical signals and currents. The circuit carrier 30 and the conductor path carrier 20 are mounted on a base plate 10. The circuit carrier 30 is arranged in a cavity 14 which is formed by a housing part 11, wherein the conductor path carrier 20 is guided between the base plate 10 and the housing part 11 into the cavity 14 and adhered at least partly to the base plate 10 by means of a liquid-resistant adhesive 22 and sealed relative to the housing part 11 by means of at least one gasket element 12, such that no liquid can penetrate into the cavity 14.

In a perspective illustration, FIG. 1 shows the basic structure of the sealing concept for the electronics space 14 of a transmission control device; FIG. 2 shows the structure as per FIG. 1 in a side view.

FIG. 3 shows the extract X from FIG. 2 in a magnified illustration. The illustrated layer structure of a flexible conductor path carrier 20 usually consists of a first base film 24 and a second cover film 21, each of these being made of e.g. polyamide, wherein conductor paths 23 of e.g. copper (Cu) are embedded between said films. A solid unit is produced by using an acrylic adhesive 22 between the layers 21 and 24.

FIG. 4 shows the flexible layout of a mechatronic transmission control unit; FIG. 5 shows the basic structure of a mechatronic control unit when using an integral, single-layer flexible circuit board 20.

The above described sealing concept is disclosed in e.g. U.S. Pat. No. 6,300,566 B1 or EP 0 972 318 B1, wherein single-layer oil-resistant flexible circuit boards 20 are used without exception for the distribution of current and signals for reasons of cost. This special flexible material 20 is currently always embodied as an integral component, i.e. the film 20 completely surrounds the circuit carrier 30, which means the use of large areas of expensive flexible material 20. Moreover, a rectangular area 29 which cannot be used must be left open for the electronics 30 in the central area of the film 20. In order to reach all connector areas 33, 34 at the same time as optimally exploiting the possible uses, a specially developed folding technique is utilized. It is nonetheless unavoidable that rejects frequently occur, since the transmission installation spaces do not allow otherwise.

SUMMARY OF THE INVENTION

With this as its starting point, the present invention addresses the problem of specifying measures which firstly allow a considerable reduction in the area of the expensive flexible material, particularly in mechatronic control apparatuses. Furthermore, measures will be specified for ensuring comparable impermeability.

According to the invention, this problem is solved by the features in the independent patent claim. Advantageous embodiments and developments, which can be used singly or in combination with each other, are the subject matter of the dependent claims.

The invention develops control apparatuses of the type in question, in that provision is made for at least one partial flexible circuit board which at the most partially i.e. not completely surrounds the circuit carrier as a conductor path carrier, wherein preferably two to n (in particular four) partial flexible circuit boards are provided.

In order that the pressed edges of the partial flexible circuit board can also be sealed using gaskets similar to the well-tested sealing concept described in the introduction over the service life of a control apparatus, various advantageous embodiments and developments are specified below.

In a first embodiment, it is thus proposed that in the boundary area of the partial flexible circuit board(s) a smooth slope is formed, preferably as far as the level of the base plate, such that the remaining transition zone can be permanently sealed using a gasket element. The formation of the perimeter slope can be achieved, for example, by means of a shaping tool which permanently shapes the boundary area at least in places, wherein the resulting transition zone can advantageously be permanently sealed by means of the sealing element.

Alternatively or in addition to this, it is proposed that (e.g. epoxy-based) adhesive dots be placed in the boundary areas of the partial flexible circuit board(s), wherein the gasket element is positioned on said dots and forms a seal thus.

In a further embodiment, it is proposed that an adhesive track be deposited in areas between the partial flexible circuit board(s), forming an elevation which is identical to that of the partial flexible circuit board(s). This advantageously ensures that the gasket element lies on a plane again. The gasket element then lies level on the partial flexible circuit board(s) and in the transition zones on the adhesive track(s). This ensures that the gasket element lies on a plane again. The pressed boundary areas of the partial flexible circuit board(s) are sealed by means of the adhesive track. Use of a screen printing method is well proven for applying the adhesive tracks, such that any imperfections at the pressed boundary areas can be advantageously evened out immediately.

In a further embodiment, it is proposed that an adhesive bead is applied circumferentially, wherein the gasket element is positioned on said adhesive bead. In this case, the (e.g. epoxy) adhesive bead advantageously seals all interfaces to the partial flexible circuit board(s), the base plate and the housing simultaneously.

In a further embodiment, it is proposed that in the areas where the partial flexible circuit board(s) rest on the base plate, a smooth transition zone be formed in the base plate. This advantageously produces an identical elevation of base plate and top side of the partial flexible circuit board(s).

According to the invention, after adhesion of the partial flexible circuit board(s) by means of a liquid-resistant adhesive on the base plate, a circumferential and continuous gasket profile is preferably deposited on the components, e.g. by means of a spraying method, advantageously thereby securely closing all unevennesses and possible openings between the partial flexible circuit board(s) and the base plate or floor plate. The housing part together with the gasket element can be located on the continuous gasket profile by means of an adhesive connection. Alternatively or in addition to this, the housing part together with the gasket element can be located and mechanically secured onto the continuous gasket profile, e.g. by means of rivets. An exclusively mechanical securing advantageously allows non-destructive opening for any repairs or recycling activities subsequently.

It is appropriate suitably to support the course of the gasket element in respect of the sealing properties by means of structural measures in the housing part and/or the base plate. The concept can also be advantageously supported by a special embodiment of the gasket element.

In particular, in a further embodiment of the development, it is proposed to configure the cover film below the gasket element such that it is set back in relation to the base film in the boundary area of the partial flexible circuit board(s), thereby reducing the height of the step at the flexible pressed edge.

The present invention has the advantage of significant cost savings due to a reduction in the flexible material (by a factor of 2 to 3). Moreover, it allows previously unknown structural freedom in the layout of the device design, e.g. a variable arrangement of the flexible parts, a simplified implementation of intersections by means of superimpositions of two flexible parts and/or possibly minimizing the number of rivets, even to the extent that these are omitted altogether. In addition, the present invention allows an effective combination of pressed screen technology and flexible technology, particularly in the field of valve contacting using connection paths to the electronics space, and in the use of the well-tested Siemens VDO laser welding method for flexible to pressed screen, or in the use of a flexible film in the sealing region and in the region of the plug connector and the sensors, if applicable, in order to achieve optimal tolerance equalization. Lastly, the present invention provides cost savings in manufacturing and assembly, particularly in respect of the folding processes, as well as increased quality in the use of a small number of well-tested connection technologies such as bonding, laser welding, etc., a reduction in purchase prices of flexible materials as a result of using a plurality of possible suppliers thereof (reduced complexity and tolerance requirements) and finally, as a result of switching from a single complex flexible complete part to a combination of a plurality of simple flexible individual parts, it advantageously shortens the development times of mechatronic control devices, particularly those installed in the transmission or engine of a motor vehicle.

BRIEF DESCRIPTIONS OF THE DRAWINGS

Additional details and further advantages of the invention are described below with reference to a preferred exemplary embodiment in connection with the appended drawing, in which:

FIG. 1 schematically shows a perspective illustration of the basic structure of the sealing concept of the electronic space of a transmission control device;

FIG. 2 schematically shows the structure as per FIG. 1 in a side view;

FIG. 3 schematically shows the extract X from FIG. 2 in a magnified illustration of the side view;

FIG. 4 schematically shows the flexible layout of a mechatronic transmission control unit;

FIG. 5 schematically shows the basic structure of a mechatronic control unit when using a single-part, single-layer flexible circuit board;

FIG. 6 schematically shows the basic structure of a mechatronic control unit when using a plurality of single-layer partial flexible circuit boards according to the invention;

FIG. 7 schematically shows the exemplary embodiment as per FIG. 6 including shaped flexible boundary areas;

FIG. 8 schematically shows the shaped flexible boundary areas from FIG. 7 in a side view;

FIG. 9 schematically shows the exemplary embodiment as per FIG. 6 including flexible boundary areas which have been adhered by means of adhesive dots;

FIG. 10 schematically shows the exemplary embodiment as per FIG. 6 including flexible boundary areas which have been adhered by means of equalizing adhesive tracks;

FIG. 11 schematically shows the flexible boundary areas which have been adhered by means of equalizing adhesive tracks as per FIG. 10 in a side view;

FIG. 12 schematically shows the exemplary embodiment as per FIG. 6 including flexible boundary areas which have been adhered by means of an adhesive bead;

FIG. 13 schematically shows the exemplary embodiment as per FIG. 6 including shaped aluminum base plate;

FIG. 14 schematically shows the shaped aluminum base plate from FIG. 13 in a side view;

FIG. 15 schematically shows the exemplary embodiment as per FIG. 6 including pointed gasket.

DESCRIPTION OF THE PREFERRED EMBODIMENTS

In the following description of the preferred embodiments of the present invention, identical reference signs designate identical or comparable components.

Figure 1:
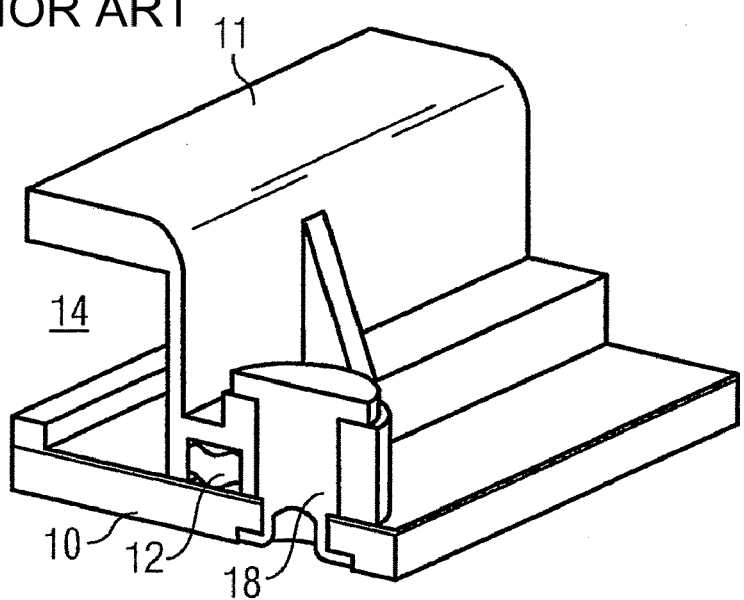
FIG. 1 shows the basic structure of the sealing concept of the electronic space of a transmission control device in a perspective illustration.

The half of a reflectively or rotationally symmetrical body is shown. A conductor path carrier 20 is guided through a housing wall 11. More precisely, the conductor path carrier 20 is guided between a metallic base plate 10 and a housing part which is formed as a housing wall 11 into a cavity 14. The conductor path carrier 20 is adhered onto the base plate 10, which preferably consists of aluminum, using an oil-resistant acrylic adhesive 22. The housing wall 11 is part of a housing cover which is preferably a plastic molded part. The housing 11 consists solely of the housing cover and the base plate 10, and includes a circumferential oil-resistant sealing ring 12 of fluorosilicone, for example. This 12 is pressed or vulcanized onto the conductor path carrier 20 and seals the conductor path carrier 20 relative to the housing wall 11. In addition to adhesive connections, mechanical securing is also possible in this context, e.g. by means of rivets 18 (only shown in FIG. 1). However, the housing can also consist of a plurality of parts or parts of a different nature (not illustrated). Moreover, the base plate 10 does not have to be a unitary part.

Figure 2:
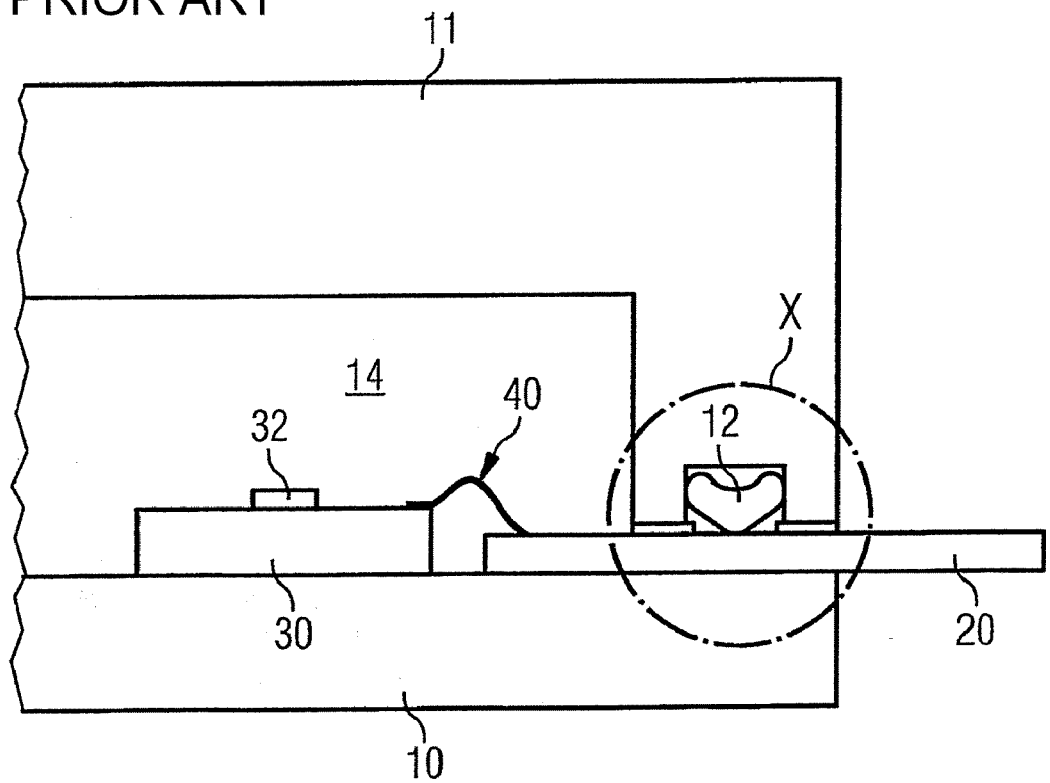
FIG. 2 shows the structure as per FIG. 1 in a side view.
Figure 3:
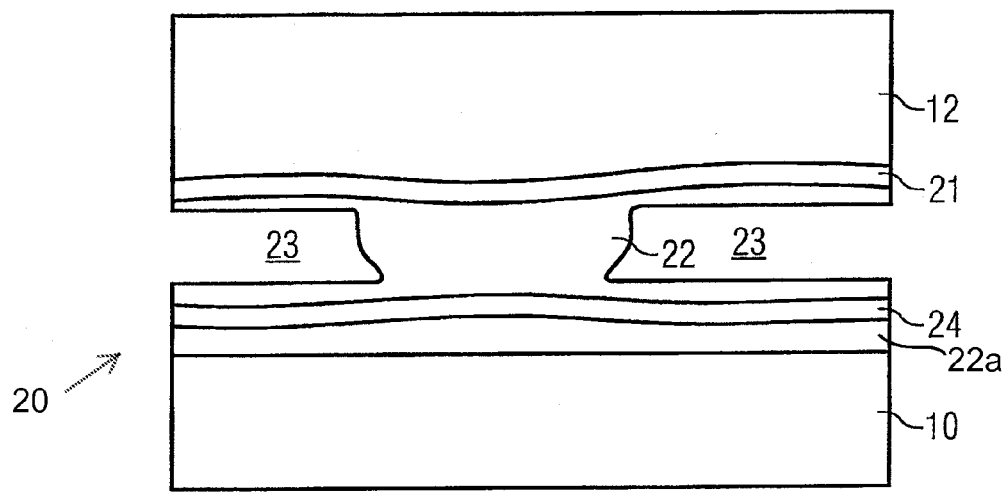

FIG. 3 shows the extract X from FIG. 2 in a magnified illustration. The illustrated layer structure of a flexible conductor path carrier 20 consists of a first base film 24 and a second cover film 21, each of these being made of e.g. polyamide, wherein conductor paths 23 of e.g. copper (Cu) are embedded between said films. A solid unit is produced by using an acrylic adhesive 22 between the layers 21 and 24. The same type of acrylic adhesive 22a can also be used for adhering or laminating the base layer 24 onto the base plate or underlying plate 10. Also clearly visible is the manner in which the gasket element 12, more concisely designated below as gasket 12, adapts to the contours of the cover film 21.

Figure 4:
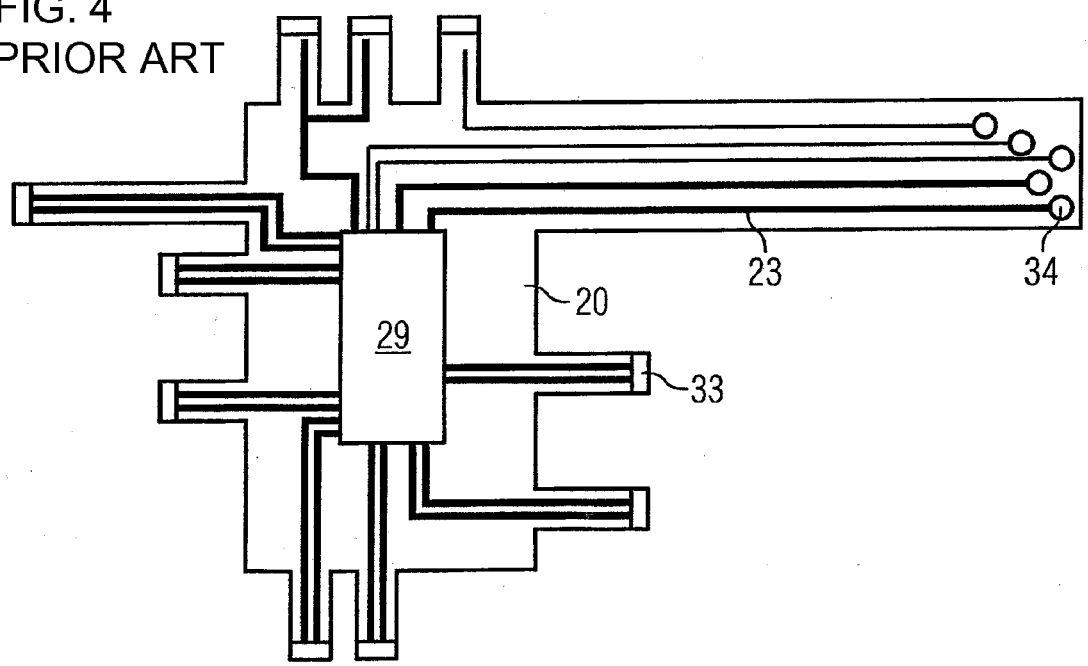

FIG. 4 shows the flexible layout of a mechatronic transmission control unit. Visible are e.g. individual lines 23 which disperse in a star format from sensors or actuators 33 and/or plug connectors 34 for connecting e.g. to the cable harness of a motor vehicle (not shown) to the control electronics 30 and electronic components 32 which are arranged thereupon. It is clear that provision is made for an opening in the center of the flexible layout, and the circuit carrier 30 including the control electronics circuit 32 is positioned in said opening.

Figure 5:
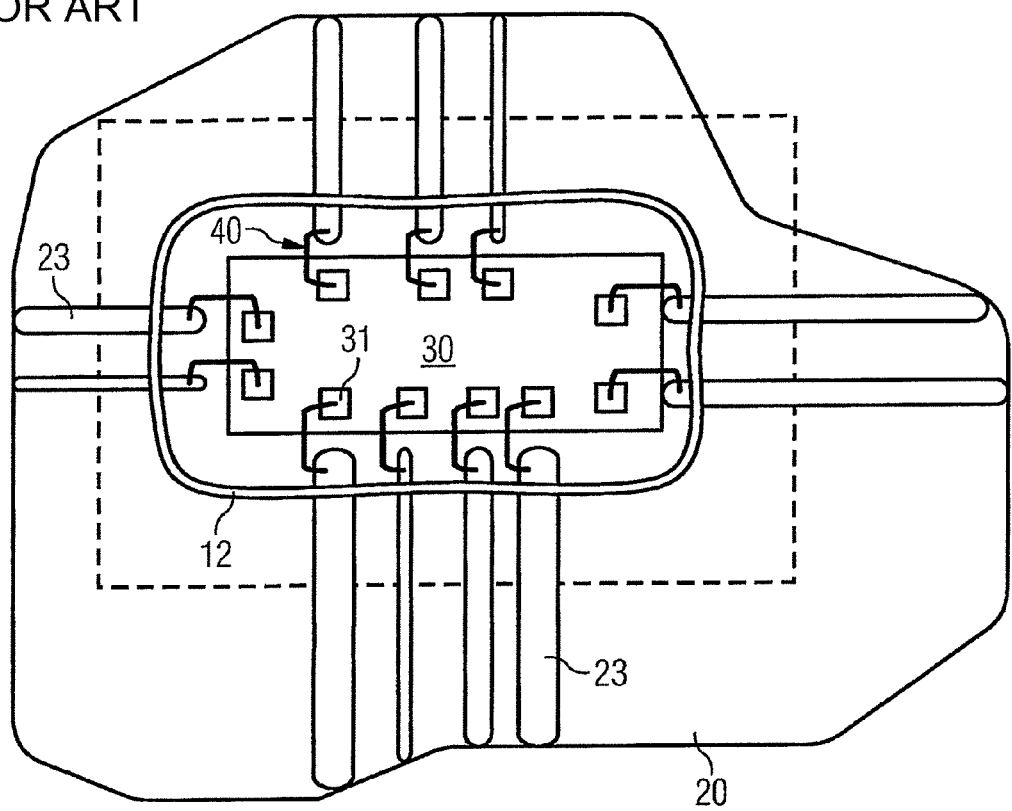

FIG. 5 shows the basic structure of a mechatronic control unit when using a single-part, single-layer flexible circuit board 20 in an interior view in detail. It is possible to see the control electronics 30 which are arranged in an opening 29 in the interior area of the flexible circuit board 20. The ends of the Cu paths 23 in the flexible circuit board 20 are connected to the electronics 30 via electrical contact points 31 by means of bonding connections 40. The position of the circumferential gasket 12 is also indicated in this view.

Instead of a bonding connection 40, provision can also be made for the electrical connection arrangement described in U.S. Pat. No. 6,300,566 B1 or EP 0 972 318 B1, full reference to whose disclosure in this respect is made hereby.

Figure 6:
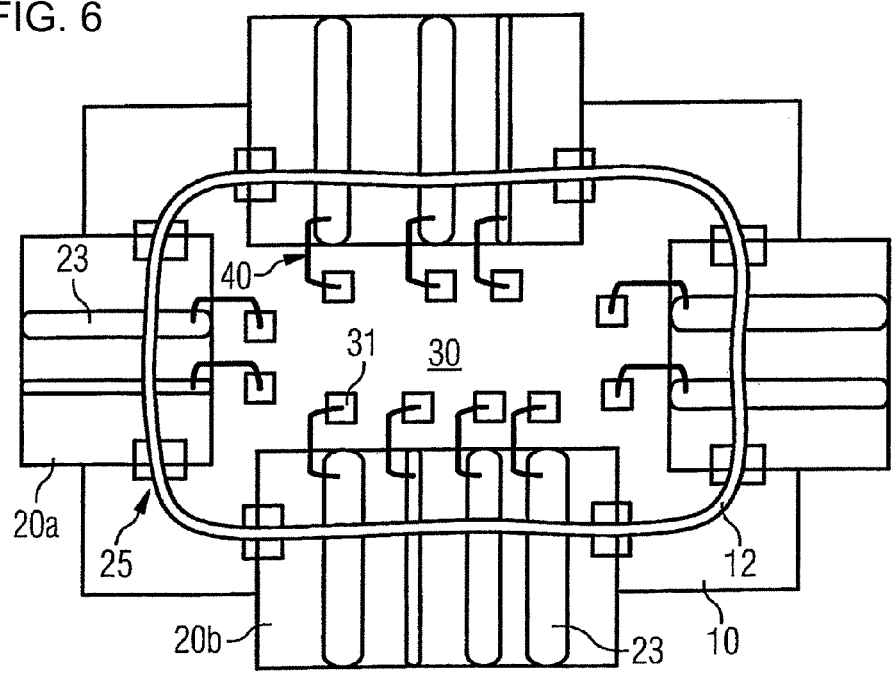
Figure 7:
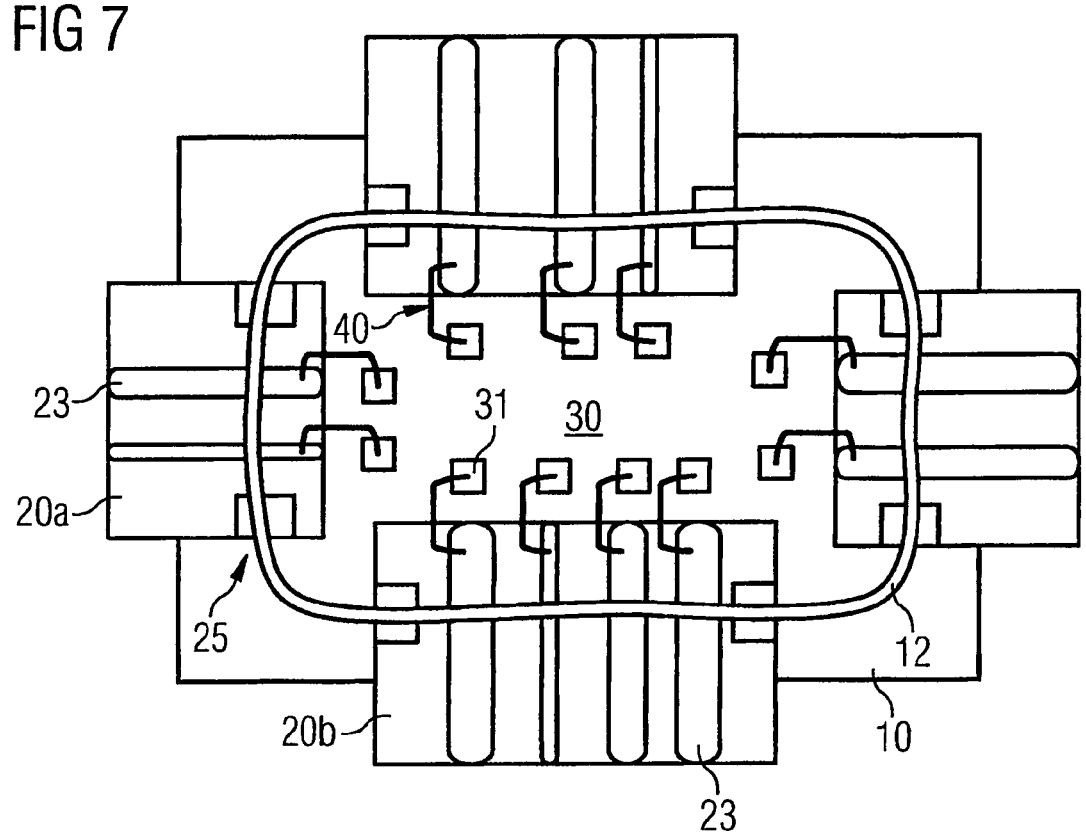

FIG. 6 shows the basic structure of a mechatronic control unit when using a plurality of preferably single-layer partial flexible circuit boards according to the invention. In order to make the boundary areas 25 of the partial flexible circuit boards 20a, 20b accessible in the area of the sealing cushion 12 of a seal through this 12, the following suitable measures are specified:

FIG. 7 shows the exemplary embodiment as per FIG. 6 with so-called shaped flexible boundary areas 25. These 25 were permanently shaped by means of a shaping tool (not illustrated) such that a smooth slope down to the aluminum level of the base plate 10 is produced in the flexible boundary area 25. The level equalization which is thus formed to the underlying plate 20 advantageously allows a permanent seal by means of the gasket 12.

Figure 8:
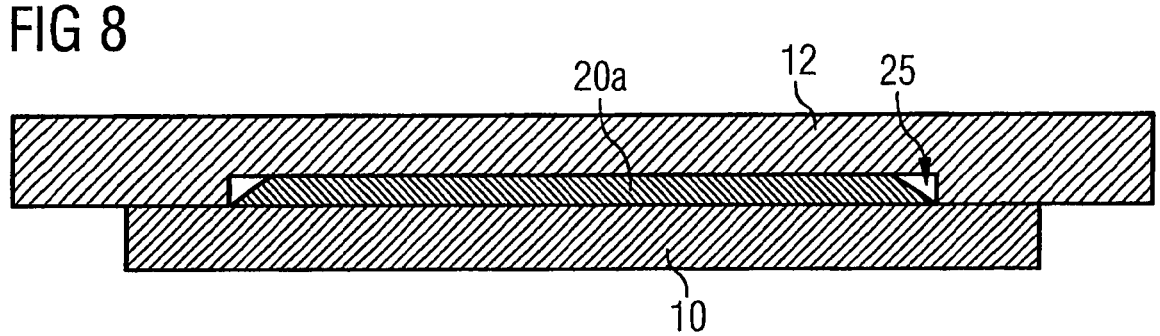

FIG. 8 shows the boundary areas 25 of the partial flexible parts 20a, 20b, . . . from FIG. 7 in a side view, said boundary areas 25 being shaped in the sealing area, thereby advantageously allowing a positive placement of the inlay seal 12 onto the shaped edge 25.

Figure 9:
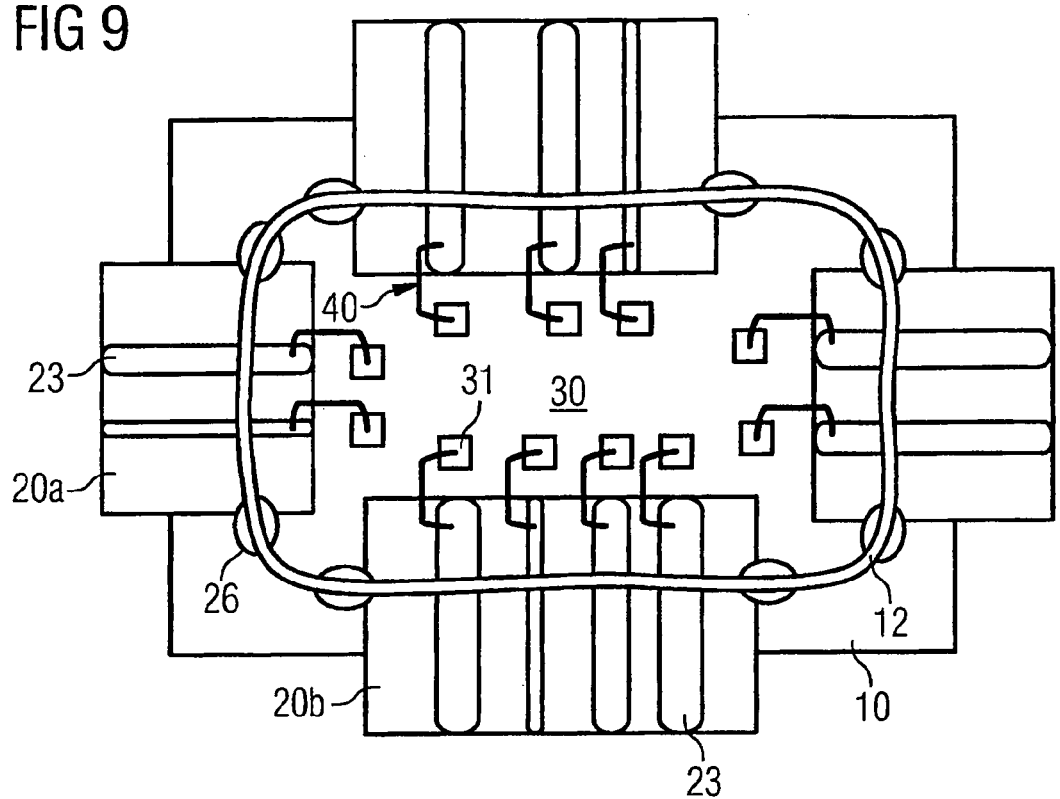

FIG. 9 shows the exemplary embodiment as per FIG. 6 including flexible boundary areas 25 which have been adhered by means of e.g. epoxy-based adhesive dots 26. The gasket 12 is then deposited.

Figure 10:
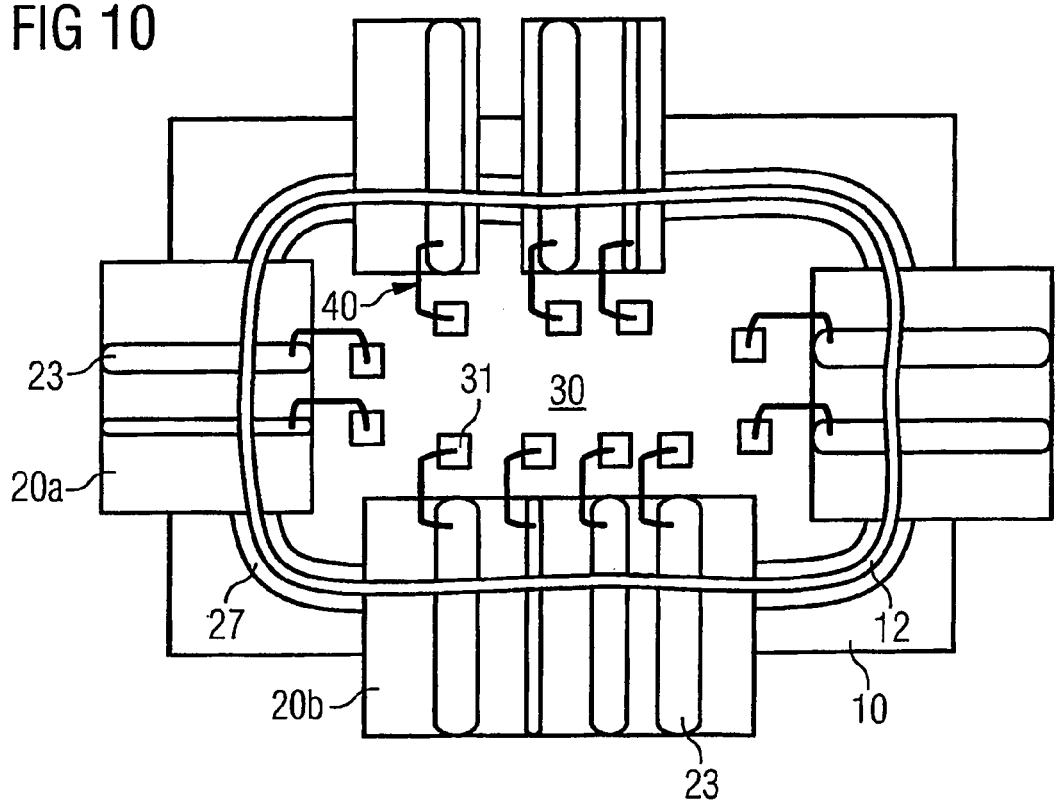

FIG. 10 shows the exemplary embodiment as per FIG. 6 including flexible boundary areas 25 which have been adhered by means of equalizing adhesive tracks 27. One or more adhesive track(s) are deposited in the curve or straight section between the two flexible parts 20a, 20b until the same elevation as the flexible parts 20a, 20b, . . . is reached. The gasket 12 then lies level on the flexible parts 20a, 20b, . . . and in the transition zones on the adhesive tracks 27. This ensures that the gasket 12 lies on a plane again. The flexible pressed edges 25 are sealed by means of the adhesive 27.

Figure 11:
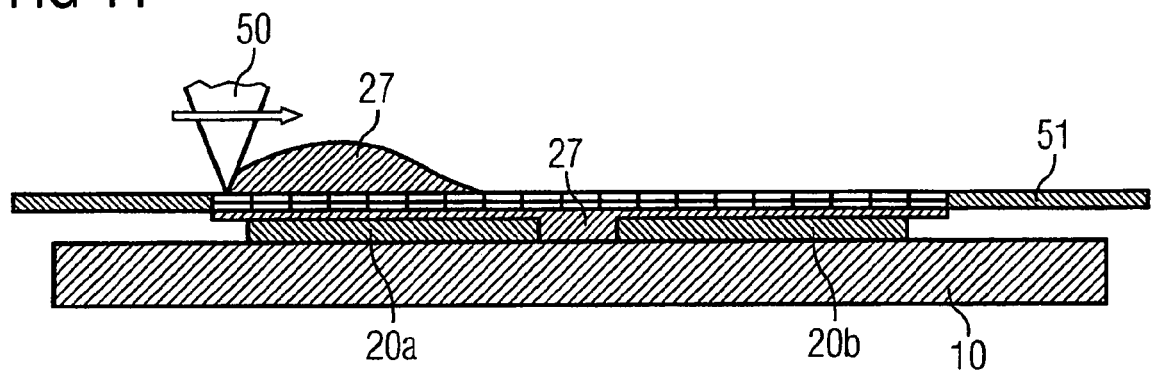

FIG. 11 shows the flexible boundary areas 25 from FIG. 10 which have been adhered by means of equalizing adhesive tracks 27 in a side view. It is shown how, in accordance with the invention, the adhesive layer 27 is preferably applied by means of a screen printing method. In this case, an adhesive 27 is deposited onto the partial flexible circuit boards 20a, 20b, . . . and the floor plate 10 by means of a screen printing squeegee through a screen such that only defined columns or partial flexible areas are filled by the adhesive 27. An arrow indicates the direction of travel of the squeegee 50. Adhesive tracks 27 which are deposited by means of a screen printing method advantageously even out any imperfections at the flexible edges 25 at the same time.

Figure 12:
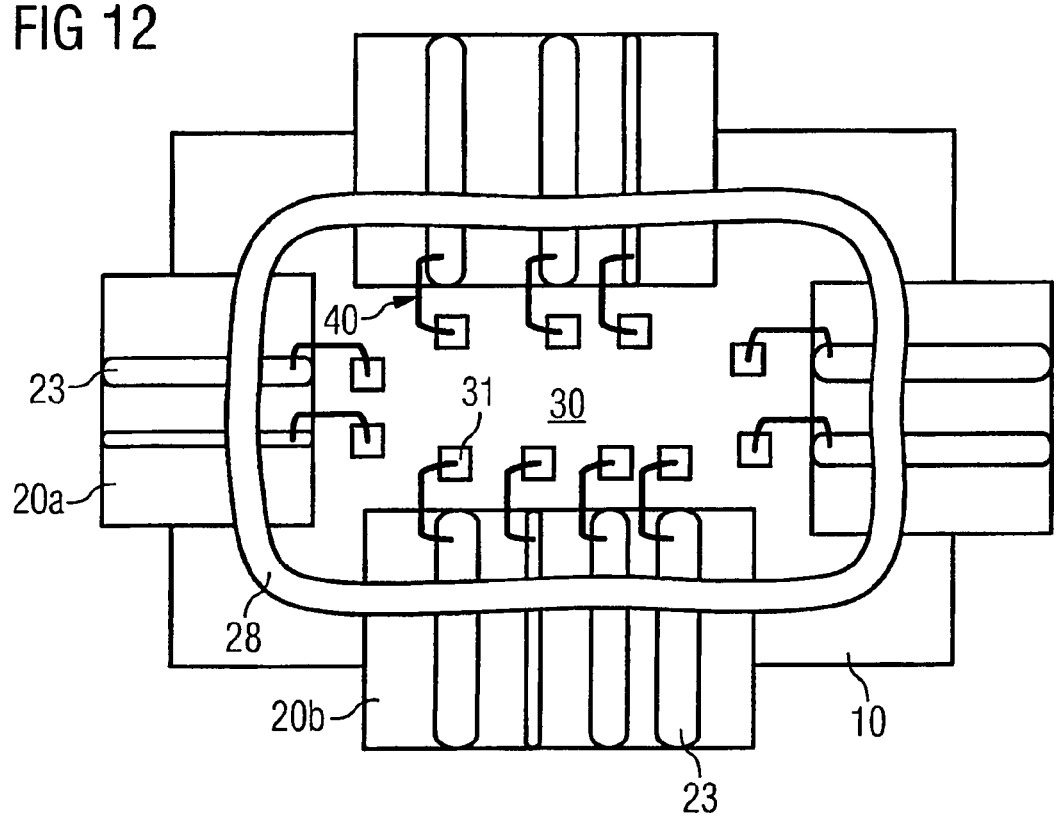

FIG. 12 shows the exemplary embodiment as per FIG. 6 including flexible boundary areas 25 which have been adhered by means of an adhesive bead 28. It can be seen how an adhesive bead 28 is deposited circumferentially and the cover 11 is adhered to the base plate 10. In this case, the adhesive (e.g. epoxy) simultaneously seals all interfaces to the flexible parts 20a, 20b, . . . , to the aluminum plate 10 and to the plastic cover 11. An acrylic adhesive film 22 which is sensitive to pressure and temperature can also be used as an adhesive, said film alone adhering the flexible parts 20a, 20b, . . . to the floor plate 10 in an oil-resistant manner. In this embodiment, it is possible to dispense with a mechanical fastening measure (e.g. rivets 18) if applicable.

Figure 13:
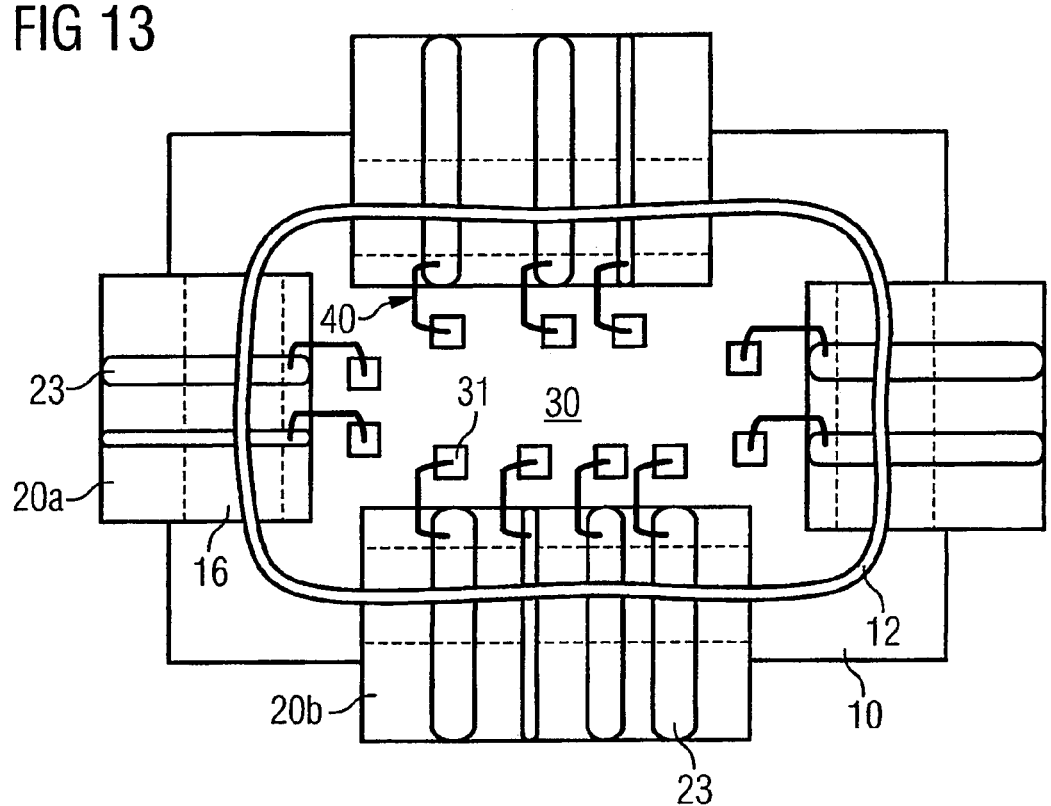

FIG. 13 shows the exemplary embodiment as per FIG. 6 including an aluminum base plate 10 which is shaped in the areas where the flexible parts 20a, 20b, . . . are situated. In this way, the same elevation is obtained for the floor plate 10 and top sides of the partial flexible circuit boards 20a, 20b, . . . . The contour width of the floor plate 10 is advantageously somewhat larger than the width of the partial flexible circuit board 20a, 20b, . . . . The resulting "hole" between flexible part edge 25 and contour depth 16 on the floor plate 10 can be filled e.g. by means of surplus adhesive 22 during the flexible part laminating process or equalized by means of additionally placed adhesive dots 26. Residual unevennesses on the resulting surface which must be sealed relative to the cover 11 are significantly smaller than the original flexible part thickness and can be sealed reliably by means of the gasket 12.

Figure 14:
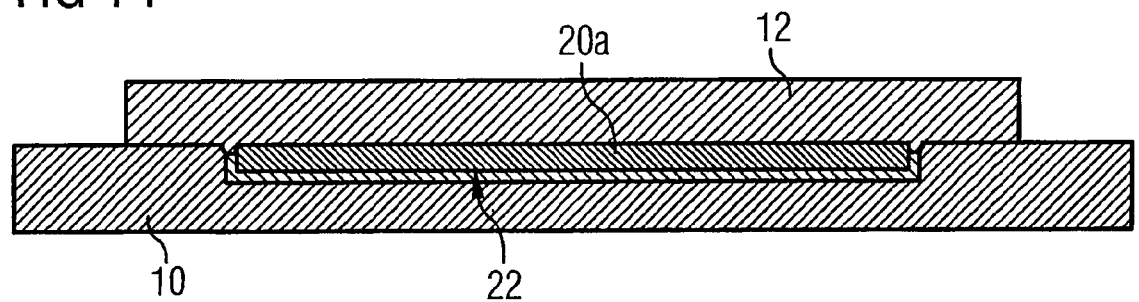

FIG. 14 shows the shaped aluminum base plate 10 from FIG. 13 in a side view.

Figure 15:
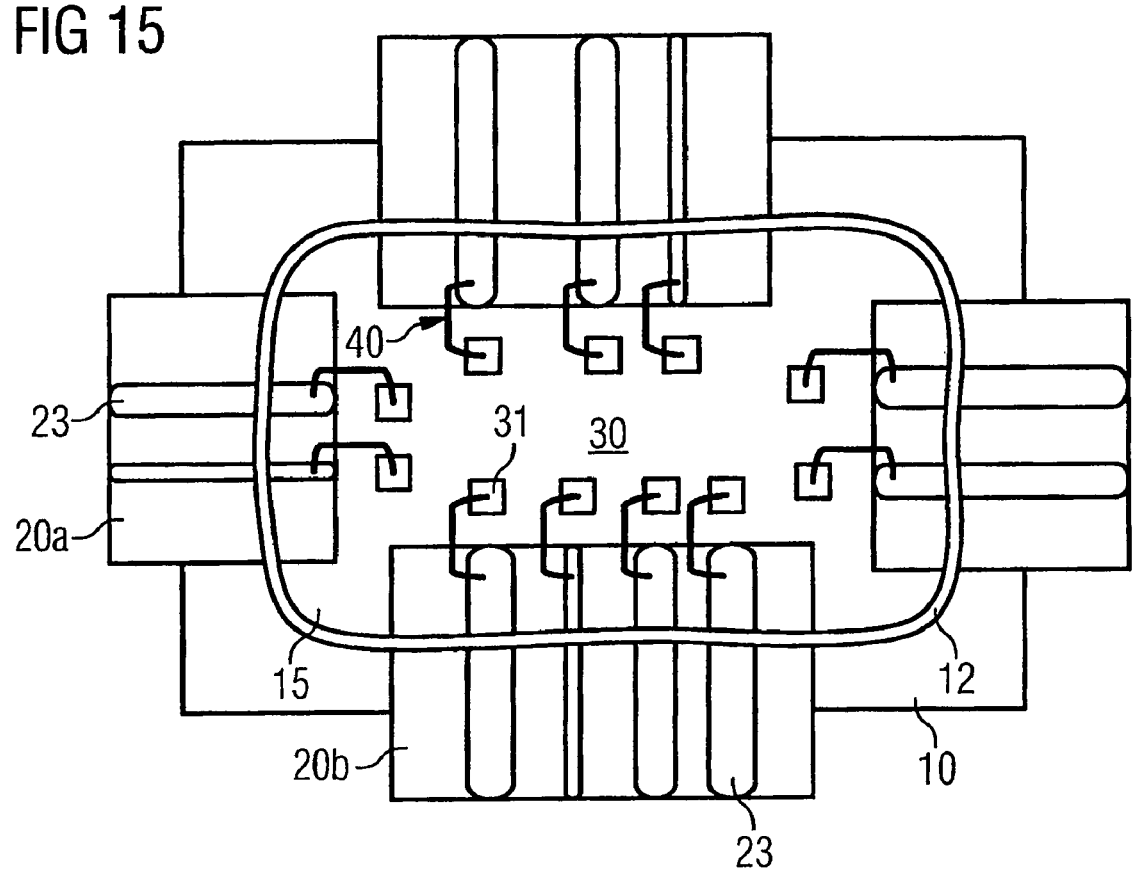

FIG. 15 lastly shows the exemplary embodiment as per FIG. 6 including pointed gasket 12. Following the lamination of the flexible part sections 20a, 20b, . . . onto the floor plate 10, a circumferential and continuous gasket profile 17 is deposited on the floor plate 10 and the flexible part modules 20a, 20b, . . . , in particular by means of spraying. In this way, any unevennesses and possible openings between partial flexible circuit boards 20a, 20b, . . . and the floor plate 10 are securely closed. The sealing cover 11 is placed onto said gasket profile 17 which is now sprayed on, and e.g. mechanically secured to the floor plate using a corresponding sealing force, e.g. by means of rivets.

The present invention advantageously and for the first time permits the arrangement of a plurality of individual partial flexible circuit boards 20a, 20b, . . . in such a way as to allow the optimal routing of signal and current paths while at the same time reducing to a minimum the use of expensive flexible surfaces 20. It therefore assists in economizing flexible surfaces 20 and in the configuration of flexible component parts such that uses can be optimally exploited and therefore no rejects occur. The individual partial flexible circuit boards 20a, 20b, . . . are preferably laminated onto a base plate 10 of aluminum. The boundary areas 25 of the partial flexible circuit boards 20a, 20b, . . . are formed using suitable measures such that a secure seal is ensured by means of a gasket.

The present invention is therefore suitable for mechatronic control units, in particular for control devices for installation in a transmission or engine of a motor vehicle.

We claim:

1. A control apparatus, comprising:
a circuit carrier; and
a base plate having mounted thereon said circuit carrier;
a plurality of flexible printed circuit boards mounted on said base plate; and
a housing part having a cavity housing said circuit carrier; wherein
said plurality of flexible printed circuit boards guided between said base plate and said housing part into the cavity; and wherein
said plurality of flexible printed circuit boards is glued at least partly to said base plate by way of a liquid-resistant adhesive and sealed relative to said housing part by way of at least one gasket element, to prevent liquid from penetrating into said cavity;
said plurality of flexible printed circuit boards at most partially, but not completely, surrounding said circuit carrier;
said plurality of flexible printed circuit boards having conductor paths formed thereon connected to said circuit carrier; and
said plurality of flexible printed circuit boards having shaped flexible boundary areas defining a smooth slope and a remaining transition zone to be permanently sealed by said at least one gasket element, wherein said plurality of flexible circuit boards are four separate flexible circuit boards each carrying the conductor paths.

2. The control apparatus according to claim 1, wherein the control apparatus is a mechatronic transmission control device or an engine control device.

3. The control apparatus according to claim 1, which further comprises adhesive dots on which said at least one gasket element is positioned, said adhesive dots being placed in boundary areas of said plurality of flexible printed circuit boards.

4. The control apparatus according to claim 1, which further comprises an adhesive track deposited between at least between one of said plurality of flexible printed circuit boards and another one of said plurality of flexible printed circuit boards, said adhesive track having an elevation identical to that of said plurality of flexible printed circuit boards.

5. The control apparatus according to claim 1, which further comprises an adhesive bead applied circumferentially, said at least one gasket element being positioned on said adhesive bead.

6. The control apparatus according to claim 1, wherein a smooth transition zone is formed in said base plate in areas where said plurality of flexible printed circuit boards rest on said base plate.

7. The control apparatus according to claim 1, which further comprises a circumferential and continuous gasket profile deposited on components after adhesion of said said plurality of flexible printed circuit boards on said base plate by a liquid-resistant adhesive.

8. The control apparatus according to claim 7, which further comprises an adhesive connection locating said housing part together with said at least one gasket element on said continuous gasket profile.

9. The control apparatus according to claim 7, wherein said housing part together with said at least one gasket element is located and mechanically secured onto said continuous gasket profile.

10. The control apparatus according to claim 9, which further comprises rivets locating and mechanically securing said housing part together with said at least one gasket element onto said continuous gasket profile.

11. The control apparatus according to claim 1, which further comprises a cover film being disposed below said at least one gasket element and being set back relative to a base film in boundary areas of said plurality of flexible printed circuit boards, for reducing a step height.

12. A control apparatus, comprising:
a base plate;
a housing mounted to said base plate and forming a cavity therewith;
a circuit carrier mounted on said base plate and in said cavity;
a plurality of separate, individual flexible circuit boards at most partially, but not completely, surrounding said circuit carrier, said flexible circuit boards forming conductor path carriers with conductor paths electrically connected with said circuit carrier and guided out of said housing for connection to said circuit carrier;
said flexible circuit boards being at least partly glued to said base plate by way of a liquid-resistant adhesive and sealed relative to said housing by way of at least one gasket element, to prevent liquid from penetrating into said
cavity, wherein said plurality of flexible circuit boards are four separate flexible circuit boards each carrying the conductor paths.

13. The control apparatus according to claim 12, which comprises bonding connections inside said housing connecting said conductor paths to respective contact points on said circuit carrier.

* * * * *